(12) United States Patent
Jackson

(10) Patent No.: US 6,700,439 B2
(45) Date of Patent: Mar. 2, 2004

(54) ZERO-BIAS BYPASS SWITCH

(75) Inventor: Donald G. Jackson, Garland, TX (US)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/120,750

(22) Filed: Apr. 11, 2002

(65) Prior Publication Data

US 2003/0193368 A1 Oct. 16, 2003

(51) Int. Cl.[7] .................................................. H03F 1/02
(52) U.S. Cl. ............................. 330/9; 330/51; 327/124
(58) Field of Search ............................ 330/51, 9, 151, 330/124 D, 124

(56) References Cited

U.S. PATENT DOCUMENTS

| | | | |
|---|---|---|---|
| 4,291,277 A | 9/1981 | Davis et al. | 330/149 |
| 4,967,164 A | 10/1990 | Sari | 330/149 |
| 5,105,445 A | 4/1992 | Karam et al. | 375/60 |
| 5,105,446 A | 4/1992 | Ravoalavoson et al. | 375/60 |
| 5,107,520 A | 4/1992 | Karam et al. | 375/60 |
| 5,113,414 A | 5/1992 | Karam et al. | 375/60 |
| 5,148,448 A | 9/1992 | Karam et al. | 375/60 |
| 5,155,448 A | 10/1992 | Powell | 330/149 |
| 5,157,346 A | 10/1992 | Powell et al. | 330/151 |
| 5,323,119 A | 6/1994 | Powell et al. | 330/151 |
| 5,386,198 A | 1/1995 | Ripstrand et al. | 330/52 |
| 5,444,418 A | 8/1995 | Mitzlaff | 330/52 |
| 5,491,454 A | 2/1996 | Matz | 330/149 |
| 5,508,657 A | 4/1996 | Behan | 330/151 |
| 5,524,286 A | 6/1996 | Chiesa et al. | 455/126 |
| 5,528,196 A | 6/1996 | Baskin et al. | 330/151 |
| 5,570,063 A | 10/1996 | Eisenberg | 330/149 |
| 5,589,797 A | 12/1996 | Gans et al. | 330/149 |
| 5,598,436 A | 1/1997 | Brajal et al. | 375/297 |
| 5,619,168 A | 4/1997 | Myer | 330/149 |
| 5,621,354 A | 4/1997 | Mitzlaff | 330/52 |
| 5,644,268 A | 7/1997 | Hang | 330/151 |
| 5,732,333 A | 3/1998 | Cox et al. | 455/126 |
| 5,742,201 A | 4/1998 | Eisenberg et al. | 330/2 |
| 5,745,006 A | 4/1998 | Budnik et al. | 330/149 |
| 5,748,678 A | 5/1998 | Valentine et al. | 375/297 |
| 5,757,231 A | 5/1998 | Tozawa | 330/151 |
| 5,760,646 A | 6/1998 | Belcher et al. | 330/149 |
| 5,789,927 A | 8/1998 | Belcher | 324/622 |
| 5,796,304 A | 8/1998 | Gentzler | 330/52 |
| 5,808,512 A | 9/1998 | Bainvoll et al. | 330/151 |
| 5,867,064 A | 2/1999 | Van Horn et al. | 330/149 |
| 5,872,814 A | 2/1999 | McMeekin | 375/296 |
| 5,877,653 A | 3/1999 | Kim et al. | 330/149 |
| 5,892,397 A | 4/1999 | Belcher et al. | 330/149 |
| 5,898,338 A | 4/1999 | Proctor et al. | 330/149 |
| 5,898,906 A | 4/1999 | Williams | 455/75 |
| 5,903,611 A | 5/1999 | Schnabl et al. | 375/297 |
| 5,905,760 A | 5/1999 | Schnabl et al. | 375/296 |
| 5,917,375 A | 6/1999 | Lisco et al. | 330/151 |
| 5,929,703 A | 7/1999 | Sehier et al. | 330/149 |
| 5,929,704 A | 7/1999 | Proctor, Jr. et al. | 330/149 |
| 5,937,011 A | 8/1999 | Carney et al. | 375/297 |
| 5,949,283 A | 9/1999 | Proctor et al. | 3330/149 |
| 5,963,090 A | 10/1999 | Fukuchi | 330/149 |
| 5,986,499 A | 11/1999 | Myer | 330/52 |
| 6,028,477 A | 2/2000 | Gentzler | 330/149 |
| 6,029,285 A | 2/2000 | Belcher et al. | 3/149 |
| 6,046,635 A | 4/2000 | Gentzler | 330/149 |

(List continued on next page.)

Primary Examiner—Henry Choe
(74) Attorney, Agent, or Firm—Wood, Herron & Evans, LLP

(57) ABSTRACT

A zero bypass apparatus for a low noise amplifier includes a bypass circuit, and a switching circuit coupled with a low noise amplifier and with the bypass circuit. The switching circuit includes one or more solid state devices responsive to absence of a control bias for switching an RF input signal from said amplifier to the bypass circuit with a low insertion loss and high isolation.

49 Claims, 1 Drawing Sheet

U.S. PATENT DOCUMENTS

| | | | |
|---|---|---|---|
| 6,049,707 A | 4/2000 | Buer et al. | 455/314 |
| 6,052,023 A | 4/2000 | Myer | 330/2 |
| 6,057,733 A | 5/2000 | Donaldson et al. | 330/151 |
| 6,060,949 A * | 5/2000 | Kaufman et al. | 330/51 |
| 6,066,984 A | 5/2000 | Tomaru et al. | 330/149 |
| 6,069,526 A * | 5/2000 | Ballantyne | 330/51 |
| 6,075,411 A | 6/2000 | Briffa et al. | 330/149 |
| 6,078,216 A | 6/2000 | Proctor, Jr. | 330/151 |
| 6,081,156 A | 6/2000 | Choi et al. | 330/52 |
| 6,081,160 A | 6/2000 | Custer et al. | 330/286 |
| 6,104,241 A | 8/2000 | Cova et al. | 330/149 |
| 6,108,385 A | 8/2000 | Worley, III | 375/296 |
| 6,118,339 A | 9/2000 | Gentzler et al. | 330/149 |
| 6,125,266 A | 9/2000 | Matero et al. | 455/126 |
| 6,127,889 A | 10/2000 | Myer | 330/149 |
| 6,140,874 A | 10/2000 | French et al. | 330/149 |
| 6,144,255 A | 11/2000 | Patel et al. | 330/151 |
| 6,362,685 B1 * | 3/2002 | Vagher | 330/124 R |

* cited by examiner

ZERO-BIAS BYPASS SWITCH

FIELD OF THE INVENTION

This invention is generally directed to the function of providing a solid-state RF bypass for tower-mounted low noise amplifiers (LNA) when DC power to the LNA fails.

BACKGROUND OF THE INVENTION

While the invention may find other applications, the invention is described herein with specific reference to the problem of bypassing amplifiers such as low noise amplifiers in a tower-mounted active antenna system, such as a base station for wireless communications. Generally speaking, such base stations employ a number of low noise amplifiers, which in the case of so-called active antenna systems are mounted in the tower adjacent the radiating elements or antennas. On the receive side of such an installation, a low noise amplifier is typically employed at the tower top for improving signal to noise ratio and providing an amplified signal to other base station equipment which may also be tower mounted, but which is more typically mounted in a base station enclosure at the base of the tower. Since access to the tower mounted equipment requires a worker to actually climb the tower, it is considered desirable to arrange for various fail-safe devices or modes of operation of the tower mounted equipment.

One such mode of operation is an automatic bypass capability for bypassing the low noise amplifier (LNA) when a failure mode of the amplifier is detected. The invention provides a bypass upon loss of the DC bias current supplied to the tower mounted equipment, which might occur for a number of reasons. Generally, electromechanical relays have been required to perform the bypass function when DC power is lost.

In cases of a defined failure mode of the LNA, the LNA may be bypassed, feeding the received signals directly from the antenna to the base station equipment, typically at the enclosure at the base of the tower. While this may degrade the signal to noise ratio somewhat in the absence of the amplifier, it is usually considered preferable to the signal degradation which may take place when the amplifier is in a failure mode. Therefore, it is an object of the invention to provide a switching arrangement which can bypass an LNA which is in a predefined failure mode in the absence of a control bias.

Heretofore, relatively expensive and cumbersome RF or microwave-compliant relay circuits have been used to accomplish this bypass function. The switching device or relay must meet stringent requirements to assure signal quality, including a relatively low insertion loss and relatively high isolation. In addition, a relay system is subject to the usual shortcomings of mechanical switching systems, including relatively low speed, high expense, relatively large size and susceptibility to various mechanical failure modes.

When failure of a Tower Mounted Amplifier (TMA) occurs, it is necessary to bypass the Low Noise Amplifier (LNA) in order for the system to continue functioning. It is desirable that the bypass mechanism be inexpensive, low loss, and solid state in construction. Additionally, the design must function in the bypass mode with all DC input power removed.

DETAILED DESCRIPTION OF THE ILLUSTRATED EMBODIMENT

Using PIN diodes with low "zero voltage" capacitance, a bypass switch design is possible which achieves the desired goals. Insertion loss of the switch is no more than approximately 0.5 dB total (0.25 dB for each section) in the "through" path, and the switch has at least around 25 dB isolation between alternate paths. This design has loss in the normal "through" path comparable to far more expensive relays. It is a solid state design with no electromechanical components. In another embodiment of the invention, shown in FIG. 2, a further improvement of insertion loss and isolation is realized.

Figure 1:
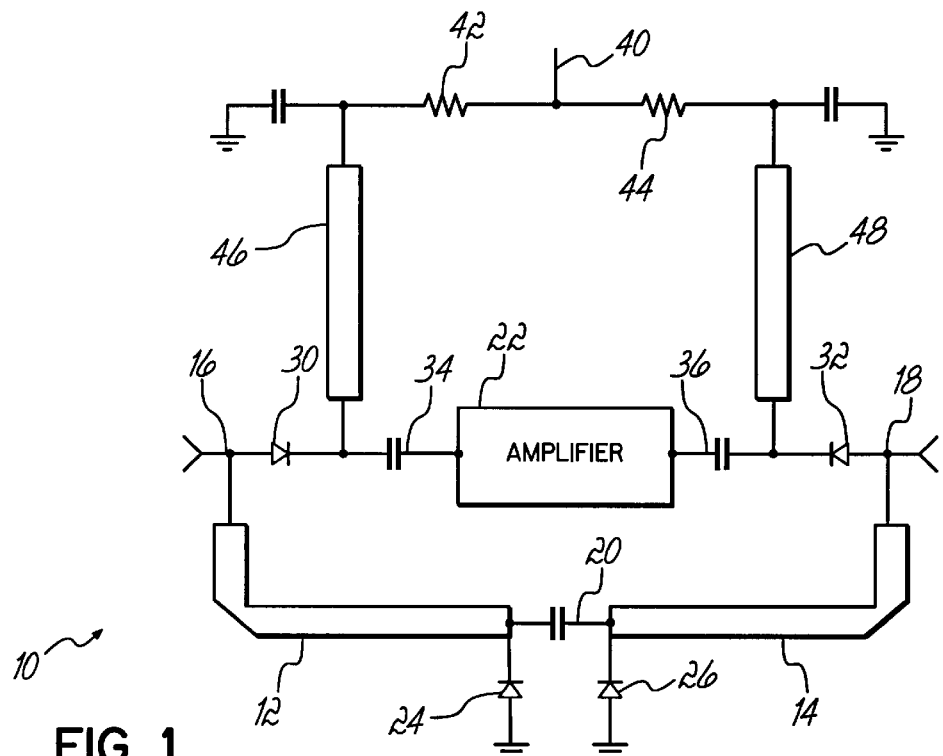
FIG. 1 is a schematic of a zero-bypass switch in accordance with one embodiment of the invention.

Referring to FIG. 1, one embodiment of a zero-bypass switch in accordance with the invention is illustrated in circuit schematic form. The switch or switching device includes a bypass circuit portion 10 which in the illustrated embodiment comprises a pair of series-coupled quarter wavelength lines 12, 14 which are coupled between an input 16 and an output 18 of the circuit. In the illustrated embodiment, the two quarter wave lines 12 and 14 are coupled in series by a DC blocking capacitor 20.

The input 16 is coupled in series with an input of the amplifier or LNA 22 which is to be bypassed by the switch or switching circuit or device of the invention. Similarly, the output 18 is coupled in series circuit with the output of this amplifier 22. A pair of switching diodes 24, 26 are coupled between the ends of the respective quarter wavelength lines 12 and 14 which are coupled to the capacitor 20, and a radio frequency (RF) ground. Additional switching diodes 30 and 32 are coupled in series respectively with the input 16 and output 18 of the amplifier 22. Respective DC blocking capacitors 34, 36 are coupled respectively intermediate the diodes 30, 32 and the input and output of the amplifier 22.

A source of control bias 40 for the switching circuit is coupled by way of suitable current limiting resistors 42 and 44 and additional quarter wavelength lines 46 and 48 to respective junctions of the diodes 30 and 32 with the capacitors 34 and 36. The polarities of the connections of the diodes 24, 26, 30, and 32 are such that with the control bias 40 present or operative, all of the diodes 24, 26, 30, and 32 are biased into a conductive condition, that is forward biased. The effect of this will be to deliver the input signal at the input 16 through the amplifier 22 to the output terminal 18. Conversely, when the control bias 40 is absent, the diodes 24, 26, 30, and 32 will be in a nonconductive condition, such that the signal path will flow from the input 16 through the quarter wavelength lines 12 and 14 to the output 18.

In one practical embodiment, the quarter wavelength lines 12, 14, and 46, 48 may be formed as microstrips on a suitable dielectric substrate.

Figure 2:
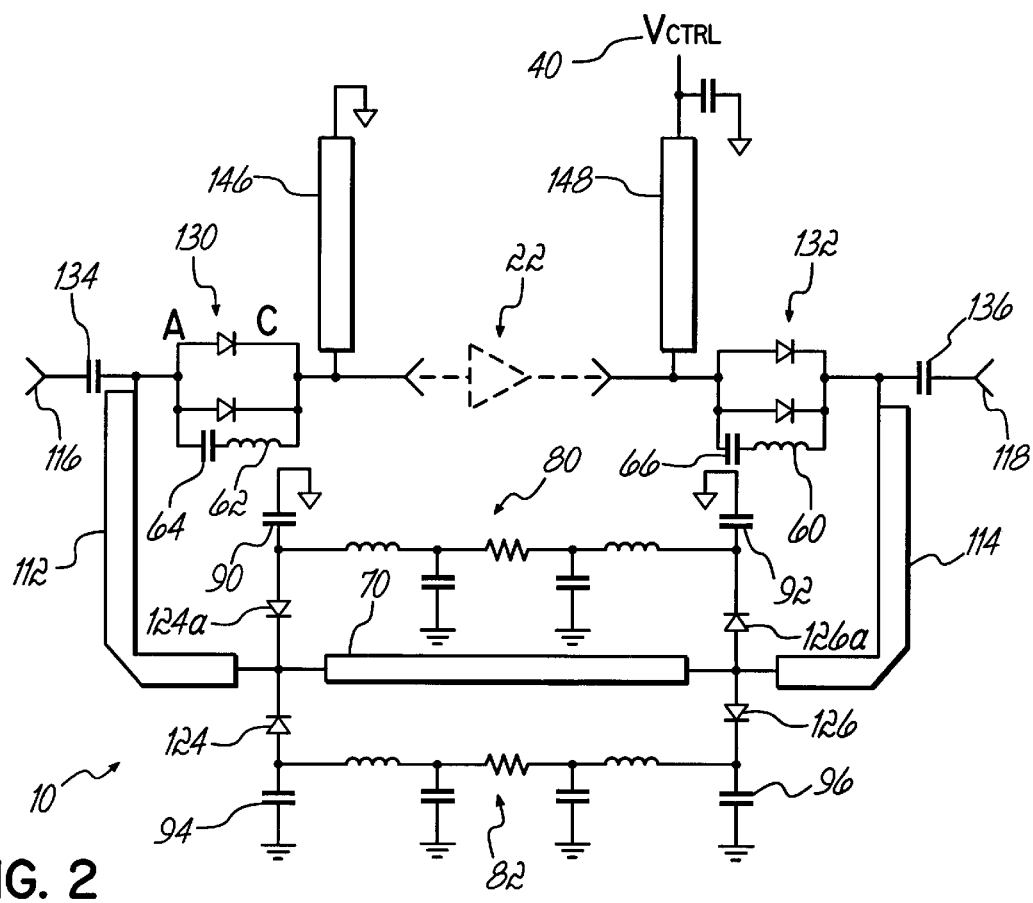
FIG. 2 is a schematic of a zero-bypass switch in accordance with another embodiment of the invention.

While the circuit of FIG. 1 presents an operative device, better performance in terms of insertion loss and isolation can be obtained by the circuit in FIG. 2, which adds a number of resonant circuits, as well as using pairs of diodes 124, 126, 130, and 132 in parallel in place of the single diodes 24, 26, 30, and 32 of FIG. 1. In addition, in the circuit of FIG. 2, the diodes are M-Pulse Microwave P/N diodes of the type MP5X7084 from M-Pulse Microwave, San Jose, Calif., or equivalent devices. With these diode components selected in the circuit of FIG. 2, insertion loss as low as 0.15 dB and isolation as high as 60 dB is obtainable.

While the circuit of FIG. 2 is similar functionally to the circuit of FIG. 1, a number of additional components are utilized, for example, to form resonant circuits, and the like.

In this regard, in the circuit of FIG. 2, the control bias voltage 40 is applied via a quarter wavelength line 148 to diodes 132 at the output side of the amplifier 22 which will be seen to be connected in reverse polarity to that shown in FIG. 1. Input diodes 130 to the amplifier 22 are coupled via a quarter wavelength line 146, to a DC ground. Both of these diode pairs 130, 132 are provided with a parallel resonant circuit comprising inductors 60, 62 and DC blocking capacitors 64, 66. The inductors 60 and 62 will resonate with the respective associated diodes 130, 132 when in the off or nonconductive state; that is, they are resonant with the residual off state capacitance of the respective associated diodes 130, 132. The remaining inductors shown in FIG. 2 are chokes.

Also in FIG. 2, an additional or third quarter wavelength line 70 is provided in series between the quarter wavelength lines 112, 114 which generally function in the same manner as the bypass circuit of FIG. 1, comprising the quarter wavelength lines 12, 14. DC blocking capacitors 134, 136 in the embodiment of FIG. 2 are coupled directly to the input 116 and output 118.

In FIG. 2, the diodes 24, 26 are replaced by respective pairs of diodes 124, 124a and 126, 126a, which are coupled with similar DC bias circuits 80, 82. The capacitors 90, 92 and 94, 96 in these resonant circuits are selected to series resonate with the diodes 124, 124a and 126, 126a in the on, or conductive state; that is, with the on state residual inductance of these diodes. The other capacitors shown in the respective circuits 80 and 82 are bypasses.

The isolation which is important is that around the feedback path or leakage path provided by the bypass. That is, with the LNA 22 in the circuit, feedback is to be minimized. The LNA gain is about 15 dB so the isolation must be considerably greater than 15 dB. Even at 25 to 30 dB isolation there can be amplitude and group delay "ripples" in the passband. Therefore, the goal is at least 50 dB isolation in the "normal" mode, i.e. with the LNA 22 in the path.

Diodes 24, 26 in FIG. 1 approximate a short when the LNA 22 is in the path. This cuts off the feedback through the loop. However, the quarter wave lines make this RF "short" look like an RF open circuit at the input and output ends 16, 18.

Referring to FIG. 2, the resonating inductances and capacitances are intended to minimize the diodes' ON-state impedances. While the resistive component cannot be changed, the reactance component can be cancelled out by use of the resonating elements. This also enhances the performance of the quarter wave lines and their ability to simulate an open circuit at one end when a diode is in conduction at the other end. It is desired for all of the diodes to have the lowest possible on resistance. As a practical matter, this is on the order of 1 Ohm.

Also in FIG. 2, the biasing scheme is changed from FIG. 1, such that the control bias is applied only at the output side, but the polarities of the diodes are now arranged so that the bypass provides a DC bias path to the anode side of the diodes 130 as well, whose cathodes remain at a ground bias at the quarter wave line 146. The appropriate DC bias is also provided at the anodes/cathodes of the respective diodes 124, 124a, 126, 126a by the circuit shown in FIG. 2. The quarter wave lines 146 and 148 are such that the DC bias can be applied without affecting the RF performance; that is, these look like open circuits to the RF or microwave signal.

The inductances characterized as chokes are essentially AC blocks and DC shorts. Conversely, the capacitors characterized as bypasses form AC shorts and DC blocks.

The circuit of FIG. 1 will operate acceptably at relatively low frequencies, for example, on the order of 100 MHz, although the quarter wave line lengths may be inconvenient. However, in order to get the noted performance of 0.15 dB insertion loss and 60 dB isolation, when transmitting or receiving at gigahertz frequencies, the somewhat more complex circuit of FIG. 2 is utilized. It will be noted that the use of solid state components and circuitry in place of relays provides additional advantages in that the DC power requirements of the solid state devices are quite low as compared to relatively high power requirements of relays, and also there are no mechanical switching transients with the use of solid state devices, as in the embodiments of the invention shown herein. Moreover, the present cost of the solid state circuit of FIG. 2 is on the order of ten to fifteen percent of circuits using microwave relays as the bypass switching devices.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A zero-bias bypass apparatus comprising:
   a bypass circuit;
   an amplifier; and
   a switching circuit coupled with the amplifier and with said bypass circuit, said switching circuit and bypass circuit comprising solid state devices;
   in the presence of a control bias, the bypass circuit being configured as open and the switching circuit being configured to direct an RF input signal to the amplifier for being amplified;
   the switching circuit being responsive to loss and subsequent absence of a control bias for switching an RF input signal from said amplifier to a closed bypass circuit to bypass the amplifier.

2. The apparatus of claim 1 wherein insertion loss of the switching circuit is a maximum of about 0.5 dB and isolation is a minimum of about 25 dB.

3. The apparatus of claim 1 wherein said bypass circuit comprises two quarter wavelength lines coupled in series to bypass said amplifier.

4. The apparatus of claim 1 wherein said switching circuit comprises at least one diode in series with an input of said amplifier, said diode being biased into a conductive state in the presence of said control bias and being biased into a nonconductive state in the absence of said control bias.

5. The apparatus of claim 1 wherein said switching circuit comprises at least one diode in series with an output of said amplifier, said diode being biased into a conductive state in the presence of said control bias and being biased into a nonconductive state in the absence of said control bias.

6. The apparatus of claim 3 wherein said switching circuit comprises at least one diode coupled from a junction of said quarter wavelength lines to a radio frequency ground, and biased into a nonconductive state in the absence of said control bias.

7. The apparatus of claim 3 and further including a DC blocking circuit in series between said two quarter wavelength lines and at least one diode coupled from either side of said DC blocking circuit to a radio frequency ground, and biased into a nonconductive state in the absence of said control bias.

8. The apparatus of claim 1 wherein said switching circuit comprises at least one diode in series with each of an input and an output of said amplifier, said diodes being biased into a conductive state in the presence of said control bias and being biased into a nonconductive state in the absence of said control bias.

9. The apparatus of claim 4 further including a quarter wavelength line coupled between a control bias and an electrode of the diode at the input of said amplifier.

10. The apparatus of claim 5 further including a quarter wavelength line coupled between a control bias source and an electrode of the diode at the output of said amplifier.

11. The apparatus of claim 3 wherein said bypass circuit includes three quarter wavelength lines coupled in series between said input and said output of said amplifier.

12. The apparatus of claim 4 wherein the switching circuit further includes a resonant circuit coupled with said diode and selected to resonate with the diode so as to minimize the impedance of the diode in an off state.

13. The apparatus of claim 5 wherein the switching circuit further includes a resonant circuit coupled with said diode and selected to resonate with the diode so as to minimize the impedance of the diode in an off state.

14. The apparatus of claim 6 wherein the switching circuit further includes a resonant circuit coupled with said diode and selected to resonate with the diode so as to minimize the impedance of the diode in an on state.

15. The apparatus of claim 6 further comprising multiple diodes coupled from junctions of said quarter wavelength lines to radio frequency ground, and multiple resonant circuits coupled with the diodes and selected to resonate with said diodes so as to minimize the impedance of the diodes in an on state.

16. The apparatus of claim 1 wherein said insertion loss is about 0.15 dB and said isolation is about 60 dB.

17. A zero-bias bypass apparatus for bypassing an amplifier comprising:
a bypass circuit having a path configured for coupling between an input and an output of an amplifier; and
a switching circuit coupled with said bypass circuit and configured for coupling with the amplifier to direct an RF input signal to the amplifier in the presence of a control bias, said switching circuit and bypass circuit comprising solid state devices, the switching circuit being responsive to loss and subsequent absence of a control bias for switching an RF input signal from said amplifier to said bypass circuit.

18. The apparatus of claim 17 wherein said insertion loss of the switching circuit is a maximum of about 0.5 dB and said isolation is a minimum of about 25 dB.

19. The apparatus of claim 17 wherein said bypass circuit comprises two quarter wavelength lines coupled in series to bypass the amplifier.

20. The apparatus of claim 17 wherein said switching circuit comprises at least one diode configured for coupling with an input of said amplifier, said diode being biased into a conductive state by said control bias and being biased into a nonconductive state in the absence of said control bias.

21. The apparatus of claim 17 wherein said switching circuit comprises at least one diode configured for coupling with an output of said amplifier, said diode being biased into a conductive state by said control bias and being biased into a nonconductive state in the absence of said control bias.

22. The apparatus of claim 19 wherein said switching circuit comprises at least one diode coupled from a junction of said quarter wavelength lines to a radio frequency ground and biased into a nonconductive state in the absence of said control bias.

23. The apparatus of claim 19 and further including a DC blocking circuit in series between said two quarter wavelength lines and at least one diode coupled from either side of said DC blocking circuit to a radio frequency ground, and biased into a nonconductive state in the absence of said control bias.

24. The apparatus of claim 17 wherein said switching circuit comprises at least one diode configured to be in series with each of an input and output of said amplifier, said diodes being biased into a conductive state in the presence of said control bias and being biased into a nonconductive state in the absence of said control bias.

25. The apparatus of claim 20 and further including a quarter wavelength line coupled between a control bias and an electrode of the diode configured to be at the input of the amplifier.

26. The apparatus of claim 21 and further including a quarter wavelength line coupled between a control bias and an electrode of the diode configured to be at the output of the amplifier.

27. The apparatus of claim 19 and further including a third quarter wavelength line in series with said two quarter wavelength lines.

28. The apparatus of claim 20 wherein the switching circuit further includes a resonant circuit coupled with said diode and selected to resonate with the diode so as to minimize the impedance of the diode in an off state.

29. The apparatus of claim 21 wherein the switching circuit further includes a resonant circuit coupled with said diode and selected to resonate with the diode so as to minimize the impedance of the diode in an off state.

30. The apparatus of claim 22 wherein the switching circuit further includes a resonant circuit coupled with said diode and selected to resonate with the diode so as to minimize the impedance of the diode in an on state.

31. The apparatus of claim 22 further comprising multiple diodes coupled from junctions of said quarter wavelength lines to radio frequency ground, and multiple resonant circuits coupled with the diodes and selected to resonate with said diodes so as to minimize the impedance of the diodes in an on state.

32. The apparatus of claim 17 wherein said insertion loss is about 0.15 dB and said isolation is about 60 dB.

33. A method for selectively bypassing an amplifier, comprising:
coupling a bypass circuit to an amplifier;
directing an RF input signal to the amplifier in the presence of a control bias and
in response to the loss and subsequent absence of the control bias to at least one solid state device, switching the RF input signal from said amplifier to said bypass circuit.

34. The method of claim 33 wherein said insertion loss of the switching is a maximum of about 0.5 dB and said isolation is a minimum of about 25 dB.

35. The method of claim 33 wherein coupling the bypass circuit comprises coupling two quarter wavelength lines in series to bypass said amplifier.

36. The method of claim 33 wherein said switching comprises coupling at least one diode in series with an input of said amplifier and biasing said diode into a conductive state with said control bias and into a nonconductive state by removing the control bias.

37. The method of claim 33 wherein said switching comprises coupling at least one diode in series with an output of said amplifier and biasing said diode into a conductive state with said control bias and into a nonconductive state by removing the control bias.

38. The method of claim 35 wherein said switching comprises coupling at least one diode from a junction of said quarter wavelength lines to a radio frequency ground, and biasing said diode into a nonconductive state by removing the control bias.

39. The method of claim 35 and further including coupling a DC blocking circuit in series between said two quarter wavelength lines and wherein said switching also uses at least one diode coupled from either side of said DC blocking circuit to a radio frequency ground.

40. The method of claim 33 wherein said switching comprises coupling at least one diode in series with each of an input and an output of said amplifier and biasing said diodes into a conductive state with the control bias and into a nonconductive state by removing the control bias.

41. The method of claim 36 and wherein said biasing includes coupling a quarter wavelength line between a control bias and an electrode of the diode at the input of said amplifier.

42. The method of claim 37 and wherein said biasing includes coupling a quarter wavelength line between a control bias and an electrode of the diode at the output of said amplifier.

43. The method of claim 35 wherein said coupling further includes coupling a third quarter wavelength line between said input and said output of said amplifier and in series with said two quarter wavelength lines.

44. The method of claim 36 wherein the switching includes coupling a resonant circuit with said diode to resonate with the diode so as to minimize the impedance of the diode in an off state.

45. The method of claim 37 wherein the switching includes coupling a resonant circuit with said diode to resonate with the diode so as to minimize the impedance of the diode in an off state.

46. The method of claim 38 wherein the switching includes coupling a resonant circuit with said diode to resonate with the diode so as to minimize the impedance of the diode in an on state.

47. The method of claim 38 wherein the switching comprises coupling multiple diodes from junctions of said quarter wavelength lines to radio frequency ground and coupling multiple resonant circuits with the diodes to resonate with the diodes so as to minimize the impedance of the diodes in an on state.

48. The method of claim 33 wherein said insertion loss is about 0.15 dB and said isolation is about 60 dB.

49. A zero-bias bypass apparatus for bypassing an amplifier comprising:

a bypass circuit having a path configured for coupling between an input and an output of an amplifier, the bypass circuit comprising two quarter wavelength lines coupled in series to bypass the amplifier; and a switching circuit coupled with said bypass circuit and configured for coupling with the amplifier, said switching circuit comprising at least one solid state device, the switching circuit being responsive to absence of a control bias for switching an RF input signal from said amplifier to said bypass circuit.

* * * * *